United States Patent [19]

Robinson et al.

[11] 4,007,297
[45] Feb. 8, 1977

[54] METHOD OF TREATING SEMICONDUCTOR DEVICE TO IMPROVE ITS ELECTRICAL CHARACTERISTICS

[75] Inventors: Paul Harvey Robinson, Trenton; Ram Shaul Ronen, Kendall Park, both of N.J.

[73] Assignee: RCA Corporation, New York, N.Y.

[22] Filed: Sept. 20, 1971

[21] Appl. No.: 181,982

[52] U.S. Cl. .................................. 427/93; 427/255; 427/344

[51] Int. Cl.² .......................................... H01L 21/38

[58] Field of Search ........... 23/223.5; 148/191, 1.5, 148/186, 187, 188, 189; 427/93, 255, 344

[56] References Cited

UNITED STATES PATENTS

| | | | |
|---|---|---|---|
| 2,744,000 | 5/1956 | Seiler | 148/1.5 UX |
| 3,556,879 | 1/1971 | Mayer | 148/187 X |
| 3,556,880 | 1/1971 | Heiman et al. | 148/187 X |
| 3,692,571 | 9/1972 | Colton et al. | 427/93 |
| R28,385 | 4/1975 | Mayer | 427/93 |
| R28,386 | 4/1975 | Heiman et al. | 427/93 |

OTHER PUBLICATIONS

E. Kool, "The Surface Properties of Oxidized Silicon" 1967, pp. 34–35.

*Primary Examiner*—Charles E. Van Horn
*Assistant Examiner*—Basil J. Lewis
*Attorney, Agent, or Firm*—H. Christoffersen; R. P. Williams; T. H. Magee

[57] ABSTRACT

Certain electrical characteristics of a semiconductor device which includes a body of semiconductor material are improved by exposing the semiconductor device to a substantially water vapor free atmosphere of chlorine and heating the device in this atmosphere.

1 Claim, 3 Drawing Figures

INVENTORS.
Paul H. Robinson
Ram S. Ronen.
BY
ATTORNEY

METHOD OF TREATING SEMICONDUCTOR DEVICE TO IMPROVE ITS ELECTRICAL CHARACTERISTICS

BACKGROUND OF THE INVENTION

The invention herein disclosed was made in the course of or under a contract or subcontract thereunder with the Department of the Air Force.

The present invention relates to a method of treating a semiconductor device in order to improve certain electrical characteristics of the device.

It is known that in the making of semiconductor devices the various processing steps, particularly those which are carried out at high temperatures, often result in adversely affecting certain performance characteristics of the devices, such as the minority carrier lifetime and the current leakage properties of the devices. It is believed that these adverse effects are the result of either the redistribution or precipitation of certain contaminants in the semiconductor device. Such contaminants may be in the form of heavy metal impurities, such as gold, copper and iron, or alkali metals, such as sodium, potassium and calcium.

To overcome the problems raised by those contaminants, various techniques have heretofore been used to either prevent the contaminants from initially entering the semiconductor device and/or removing the contaminants from the semiconductor device, preferably at or near the end of the manufacturing process. To prevent the contaminants from initially entering the semiconductor device "clean handling" techniques have been used. These techniques require careful cleaning of all materials and equipment, and the carrying out of manufacturing and assemblying operations in a dust-free laminar flow atmosphere. Although these techniques are effective, they are cumbersome to employ and expensive because of the requirements for constant vigilance, contamination measurements and personnel indoctrination.

To remove the contaminants from the semiconductor device various techniques for gettering and/or out-diffusing the contaminants have been used. Such techniques include heat treatment with a phosphorus oxide glass layer on the semiconductor device or processing the semiconductor device with nickel or a nickel alloy in contact with the device. Each of these techniques has the disadvantage that it requires coating the semiconductor device with an additional material which forms no part of the active portion of the semiconductor device and can even be detrimental to the active portion of the semiconductor device. For example, the heat treatment with a phosphorus oxide glass layer can cause the diffusion of phosphorus, an N type impurity, into the semiconductor device resulting in an N type surface region which would have to be removed by etching.

Another technique which has been developed to remove the contaminants from a semiconductor device and to improve its lifetime characteristics is to heat the semiconductor device while exposed to an atmosphere containing hydrogen chloride. This technique is described in U.S. Pat. No. 3,556,879 to A. Mayer, issued Jan. 19, 1971 entitled "Method of Treating Semiconductor Devices" and in U.S. Pat. No. 3,556,880 to F. P. Heiman etal, issued Jan. 19, 1971 entitled "Method of Treating Semiconductor Devices to Improve Lifetime". Although this technique is very satisfactory for removing contaminants and improving lifetime characteristics, it does have a disadvantage of a relatively high time X temperature factor. That is, to achieve a satisfactory treatment in a short period of time it must be carried out at a relatively high temperature or if a low temperature is used the treatment must be carried out for a relatively long period of time. This high time X temperature factor of this technique can be detrimental to certain types of semiconductor devices.

SUMMARY OF THE INVENTION

In the manufacturing of a semiconductor device which includes a body of semiconductor material, the semiconductor device is exposed to a substantially water free atmosphere of chlorine and is heated to a temperature of between 800° C and 1200° C.

DETAILED DESCRIPTION

Figure 1:
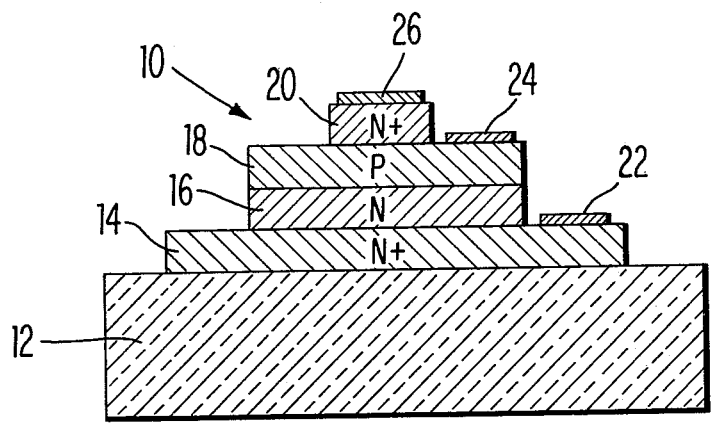
FIG. 1 is a sectional view of a bipolar transistor which was treated in accordance with the method of the present invention.

We have found that by heat treating a semiconductor device in a substantially water vapor free atmosphere of chlorine, certain metal contaminants which may be contained in the semiconductor device are removed and certain electrical characteristics of the semiconductor device are improved. More particularly, the semiconductor device is treated by placing it in a furnace which is heated to a temperature of between 800° C and 1200° C and a flow of a mixture of chlorine gas and dry oxygen is passed through the furnace and over the semiconductor device. The concentration of the chlorine should be less than about 5% and preferably is between 0.5 and 1%. Using chlorine to remove the metal contaminants from the semiconductor material of the semiconductor device and improve the electrical characteristics of the device has the advantage over the previously known technique using hydrogen chloride of achieving the desired results with a lower time X temperature factor. Thus, semiconductor devices which could be adversely affected by the higher time X temperature factor of the hydrogen chloride treatment can be satisfactorily treated by the chlorine treatment of the present invention. The following examples illustrate some of the electrical characteristics of various semiconductor devices which can be improved by the chlorine treatment of the present invention.

EXAMPLE I

A group of wafers of single crystalline silicon were placed in a furnace which was heated to 1050° C. A flow of steam was passed through the furnace for 5 minutes. This formed a thin layer of silicon oxide on a surface of the wafers. The wafers with the oxide film thereon were then treated in accordance with the method of the present invention by heating them in an atmosphere of chlorine gas and dry oxygen with the concentration of chlorine being about 1%. Different wafers were so treated at different temperatures and for different periods of time. The effective minority carrier lifetime characteristics of the wafers was measured before and after the chlorine treatment. This characteristic was measured by the technique described in detail in a paper by F. P. Heiman entitled "On the Determination of Minority Carrier Lifetime From the Transient Response of an MOS Capacitor", published in the *IEEE Transactions on Electron Devices*, November 1967, p. 781. To carry out this measurement, each of the wafers was coated with a metal film on its surface opposite to the surface on which the silicon oxide film was formed so as to provide an ohmic contact to the wafer. A mercury probe was used to make a circular contact to the silicon oxide film. Table I shows the temperature and time for the chlorine treatment for each of the wafers and the effective minority carrier lifetime before and after treatment. As can be seen from following Table, the chlorine treatment of the present invention increased the effective minority carrier lifetime of the wafers so as to improve this characteristic of the wafers.

Table I

| | Conductivity Type | Resistivity (ohm-cm) | Treatment Temperature (° C) | Treatment Time (hrs.) | Effective Minority Carrier Lifetime (ms) | |
|---|---|---|---|---|---|---|
| | | | | | Before Treatment | After Treatment |
| 1 | P | 8–11 | 950 | 2 | 0.1 | 0.3–0.5 |
| 2 | P | 8–11 | 950 | 16 | 0.1 | 1.5–2.0 |
| 3 | N | 8.5–11.5 | 950 | 16 | 0.05 | 0.6 |
| 4 | N | 8.5–11.5 | 1050 | 100 | 0.04 | 9.0 |
| 5 | N | 10 | 950 | 2 | 0.02 | 1.2 |
| 6 | N | 10 | 1050 | 2 | 1.0 | 5.25 |
| 7 | N | 10 | 1050 | 4 | 1.0 | 45.0 |
| 8 | N | 10 | 1050 | 2 | 0.5 | 4.5 |
| 9 | N | 10 | 1050 | 2 | 2.2 | 5.5 |

EXAMPLE II

Semiconductor devices of the type having a 2 micron thick layer of single crystalline silicon epitaxially deposited on a surface of a sapphire substrate were heated in a furnace at 1050° C in a steam atmosphere to form a silicon oxide film on the silicon layer. One of the semiconductor devices had P type silicon layers and others of the devices had N type silicon layers. The semiconductor devices were then treated in accordance with the method of the present invention by heating them in an atmosphere of chlorine gas and dry oxygen with the concentration of the chlorine being about 1%. The devices were so treated for 2 hours with some of the devices being treated at 950° C and others at 1050° C. The effective minority carrier lifetime characteristics of the devices were measured by the technique referred to in Example I. To carry out this measurement, an annular area of the silicon oxide was removed such as by etching, to expose an annular portion of the surface of the silicon layer. A metal film was coated on the annular portion of the surface of the silicon layer to provide an ohmic contact to the silicon layer. A mercury probe was used to make a circular contact to the portion of the silicon oxide film within the annular metal film.

The effective minority carrier lifetime of the semiconductor devices prior to the chlorine treatment was about 0.1ns or less. The effective lifetime of the devices having a P type silicon layer treated at 950° C increased to about 4ns. 4ns. effective lifetime of the devices having a P type silicon layer treated at 1050° C increased to a range of between 10 and 40ns. The effective lifetime of the devices having an N type silicon layer treated at 1050° C increased to a range of between 20 and 50ns. Thus, the chlorine treatment of the present invention substantially improved the effective minority carrier lifetime characteristic of the epitaxial silicon layers.

EXAMPLE III

Mesa type epitaxial silicon-on-sapphire bipolar transistors were treated by the method of the present invention. As shown FIG. 1 of the drawings, each of the transistors 10 is of the type which comprises a sapphire substrate 12 having an epitaxial layer 14 of N+ type single crystalline silicon on a surface thereof. An epitaxial layer 16 of N type single crystalline silicon is on the N+ type layer 14 and is of smaller area than the N+ type layer 14. An epitaxial layer 18 of P type single crystalline silicon is on the N type layer 16 and forms a PN junction therebetween. An epitaxial layer 20 of N+ type single crystalline silicon is on the P type layer 18 and forms a PN junction therebetween. The N+ type layer 20 is of smaller area than the P type layer 18. Metal contact films 22, 24 and 26 are on the N+ type layer 14, the P type layer 18 and the N+ type layer 20 respectively. In the transistor 10, the N+ type layer 20 is the emitter region, the P type layer 18 the base region and the N type layer 16 the collector region. The N+ type region 14 serves as a contact to the N type layer 16.

The transistors were treated in accordance with the method of the present invention by heating them at a temperature of 950° C for 2 hours in an atmosphere of chlorine gas and dry oxygen with the concentration of the chlorine being about 1%. Various electrical characteristics of the transistors, such as low frequency gain, base transit time and minority carrier lifetime in the base region, were measured before and after the treatment. The low frequency gain increased by a factor of 2–10 after the chlorine treatment, i.e. from about 2 before treatment to as high as 20 after treatment. The base transit time increased from a value of less than 2ns before treatment to 325ns after treatment. The minority carrier lifetime in the base region increased from about 0.1ns before treatment to 16ns after treatment. Thus, by treating bipolar transistors by the method of the present invention various electrical characteristics of the transistors are substantially improved.

EXAMPLE IV

Figure 2:
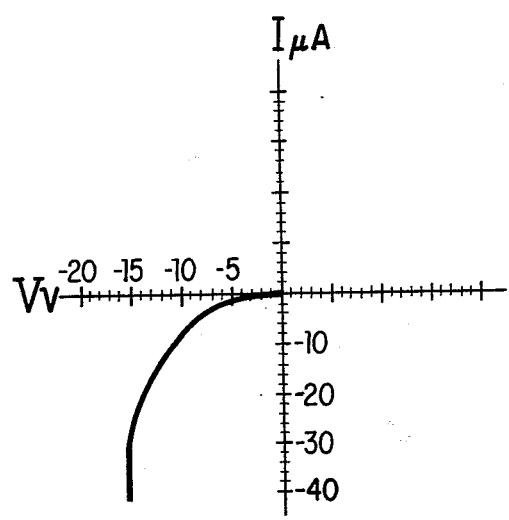
FIG. 2 is a diagram of the I–V characteristics of a PN junction of a semiconductor device prior to treatment in accordance with the method of the present invention.
Figure 3:
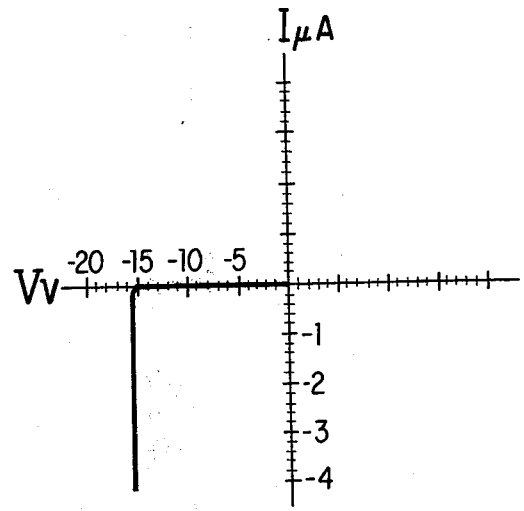
FIG. 3 is a diagram of the I–V characteristics of a PN junction of a semiconductor device after treatment in accordance with the method of the present invention.

Diode structures were treated by the method of the present invention. The diode structures were the collectorbase junction of an epitaxial bipolar transistor such as the junction between the collector region 16 and the base region 18 of the transistor 10 shown in FIG. 1. The I–V characteristics of the junction were taken before and after treating the transistor by heating it at 950° C for 2 hours in an atmosphere of chlorine gas and dry oxygen with the concentration of chlorine being about 1%. FIG. 2 shows the I–V characteristics before treatment and FIG. 3 shows the I–V characteristics after treatment. It should be noted that the current scale in FIG. 3 is different from that in FIG. 2. By comparing FIGS. 2 and 3 it can be seen that after treatment the turn on of the junction is not only much sharper but is also at almost zero current whereas prior to treatment the turn on is at about $-30\mu A$. Thus, by treating diodes by the method of the present invention, the I–V characteristics of the diodes are substantially improved.

EXAMPLE V

In certain types of semiconductor devices, such as MOS transistors and integrated circuits, a layer of silicon oxide directly on the surface of a body of single crystalline silicon serves as an active element of the device. To achieve good characteristics for these devices the interface between the silicon oxide layer and the single crystalline silicon body should be clean and closely bonded. There are two techniques generally used for providing a layer of silicon oxide on a body of silicon. One technique is to thermally oxidize the silicon body so as to grow the silicon oxide layer directly on the surface of the silicon body. The second technique is to deposit the silicon oxide layer on the surface of the silicon body from a thermally reacted gas containing silicon and oxygen. Heretofore, deposited silicon oxide layers particularly low temperature deposited layers, were not satisfactory for such semiconductor devices since they did not have a suitable interface with the silicon body.

Semiconductor devices having a 1000A thick layer of deposited silicon oxide on a surface of a body of single crystalline silicon were treated in accordance with the method of the present invention. The devices were heated at 960° C in an atmosphere of chlorine gas and dry oxygen with the concentration of chlorine being 1% for ½ hour and one hour. The capacitance-voltage (C–V) characteristics of the devices were measured before and after treatment. As described in an article by K. H. Zaininger and F. P. Heiman, entitled "The C–V Technique as an Analytical Tool", published in SOLID STATE TECHNOLOGY, Vol. 13, Nos. 5 and 6, May-June 1970, the interface characteristics between a silicon oxide layer and a body of single crystalline silicon can be determined by measuring the C–V characteristics of the device. The devices prior to treatment showed no C–V characteristics indicating a very poor silicon oxide to silicon interface. However, after treatment the devices had a nicely defined C–V curve indicating a good silicon oxide to silicon interface. Thus, by treating devices having a deposited silicon oxide layer on a body of single crystalline silicon by the method of the present invention, the silicon oxide to silicon interface is improved to an extent that the deposited silicon oxide layer can be used as an active element of the device where it could not be so used prior to the treatment.

Thus, the above examples show that the method of the present invention wherein semiconductor devices are heat treated in an atmosphere of chlorine gas and dry oxygen removes undesirable contaminants from the semiconductor material of the device and improves various electrical characteristics of various devices. The improved electrical characteristics include increasing the effective minority carrier lifetime of single crystalline silicon, both as a bulk body and an epitaxial layer; increasing the low frequency gain, the base transit time and the base region minority carrier lifetime of bipolar transistors; improving the I–V characteristics of diodes; and improving the silicon oxide to silicon interface of a deposited silicon oxide layer on a body of single crystalline silicon so as to permit the deposited silicon oxide layer to be used as an active element of a semiconductor device.

We claim:

1. A method of improving the electrical characteristics of a semiconductor device which includes a body of single crystalline silicon comprising:

depositing a layer of silicon oxide directly on a surface of the silicon body from a thermally reacted gas containing silicon and oxygen, and exposing said semiconductor device with said layer formed thereon to a substantially water vapor free atmosphere consisting of chlorine gas and oxygen, the concentration of the chlorine gas in the atmosphere being between about 0.5 and 5.0% by volume, while heating said semiconductor device to a temperature of between 800° C and 1200° C.

* * * * *